United States Patent [19]

Scheib et al.

[11] 3,863,173

[45] Jan. 28, 1975

[54] AMPLIFIER CIRCUIT FOR MINIMIZING VOLTAGE OFFSET

[75] Inventors: Paul E. Scheib; Robert H. Shumate, both of Waynesboro, Va.

[73] Assignee: General Electric Company, Waynesboro, Va.

[22] Filed: June 3, 1974

[21] Appl. No.: 475,423

[52] U.S. Cl. ........................ 330/98, 330/21, 330/25, 330/28, 330/103, 330/107

[51] Int. Cl. .............................................. H03f 1/36

[58] Field of Search ............ 330/25, 28, 21, 31, 98, 330/100, 103, 107, 109; 328/167

[56] References Cited

UNITED STATES PATENTS 3,707,685 12/1972 Geffe ............................. 330/109 X

*Primary Examiner*—James B. Mullins

[57] ABSTRACT

An improved low-pass multistage active filter circuit manufactured from monolithic and hybrid circuits is provided having a plurality of cascaded amplifier stages coupled to one another through filter sections and having an external DC negative feedback loop comprising a feedback resistor connected between the output of the lastcascaded amplifier and inverting input of the first of the cascaded amplifiers, and which feedback resistor substantially matches in resistance value the D.C. component value of an input impedance for the filter. The feedback circuit acts to eliminate a contribution to a voltage offset at each amplifier stage by nullifying, reducing or canceling an inherent voltage offset produced by each operational amplifier stage except the first operational amplifier stage.

7 Claims, 4 Drawing Figures

AMPLIFIER CIRCUIT FOR MINIMIZING VOLTAGE OFFSET

The present invention relates to improved low pass multistage active filters, and more particularly to such active filters utilizing a plurality of monolithic integrated circuit devices.

BACKGROUND OF THE INVENTION

A multistage active filter is formed by utilizing a plurality of cascaded DC or operational amplifier stages coupled to one another through filter sections.

In most DC or operational amplifiers because of imperfectness of their construction, a small voltage called voltage offset is required between the amplifier's two input terminals in order for the amplifier to be balanced. Voltage offset also occurs in DC or operational amplifiers utilizing a monolithic structure as a result of small imbalances caused by differences in the internal structure of the monolithic integrated circuit devices.

In DC or operational amplifiers, under actual operation, there is also required a small current at each of the amplifier's two inputs. Currents are designated herein as input bias currents Ib. These input bias currents (Ib) are required to make the amplifier function.

Voltage offset and bias current are normally part of the amplifier's specification and are usually specified at +25°C by a fabricator of the operational amplifier. Voltage offset and bias current are undesirable because they vary from unit to unit, and with temperature and time. In low pass filters they cascade to cause an undesirable amount of circuit offset.

Circuit designers of multistage low pass active filters are confronted with a problem of keeping the total voltage offset produced by the filter within design limits when using monolithic integrated or hybrid circuits. Manufacturers of monolithic integrated circuit devices specify the maximum value of voltage offset for each operational amplifier device which is to be used on a multistage filter, and it is not unusual for each operational amplifier stage to produce a voltage offset of the same polarity. Therefore the value of total voltage offset for an active filter utilizing a plurality of operational amplifiers can be the summation of the voltage offset for each operational amplifier stage. In addition, bias currents acting through the resistance of the filter elements cause further increase in circuit offset.

Various prior art methods have been proposed to reduce voltage offset in a single operational amplifier stage and in multistage filters utilizing such amplifiers. Such methods provide bias adjustments. However, these methods leave unsolved the problem of temperature and time variation of the filter's offset voltage. Tracking circuits can be constructed but they add to the manufacturing cost of the filter.

It is an object of this invention to reduce the value of total voltage offset for a low pass multistage active filter to between one-fifth to one-tenth of its value in prior art devices.

It is another object to eliminate the contribution to total filter offset by all but the first operational amplifier stage.

It is a further object to reduce the contribution to voltage offset caused by bias current in the first operational amplifier stage.

It is another object of this invention to produce a less costly low pass multistage filter by eliminating a need for a fixed adjustment or fixed compensation network to eliminate voltage offsets.

SUMMARY OF THE INVENTION

The present invention provides an improved low pass multistage active filter produced from monolithic and hybrid circuits. An improved cascaded RC coupled feedback operational amplifier configuration is utilized. The operational amplifiers are employed as unity gain separators, while the RC coupling networks are RC passive filter networks serially connected between adjacent operational amplifier stages. The first operational amplifier has an input impedance, such as a resistance or another filter element, connected to its positive phase or noninverting input terminal. A first feedback circuit, in the form of a DC negative feedback loop and comprising a first feedback impedance, is connected between the filter's output terminal at the output of the last operational amplifier and the negative phase or inverting input terminal. A second feedback circuit comprising a second feedback impedance is connected between the output terminal of the first operational stage and the portion of the feedback loop which is connected to the negative phase or inverting input terminal of the first operational amplifier. The second feedback impedance is dimensioned such that at and above the cut-off frequency of the filter its impedance value is substantially lower than that of the first feedback impedance, whereas for direct current its impedance value is substantially higher than that of the first feedback impedance. Also, the first feedback impedance is dimensioned such that for direct current its impedance value is substantially equal to that of said input impedance. In one embodiment the substantially higher value was of the order of 10 times whereas the substantially lower value was of the order of one tenth. The improved filter circuit configuration embodying the invention acts to eliminate a contribution to voltage offset at each amplifier stage by nullifying, reducing, or canceling the inherent voltage offset produced by each operational amplifier stage except the first operational amplifier stage. The improved filter circuit configuration embodying the invention further employs the capacitive impedance to control the closed loop gain at all but very low frequencies. At higher frequencies or at operating frequencies other than DC, the first operational amplifier stage gain is unity because the capacitor impedance suppresses the AC gain.

DESCRIPTION OF THE DRAWING

While the specification concludes with claims particularly pointing out and distinctly claiming that which is regarded as the present invention, certain details of a preferred embodiment of that invention along with further objects and advantages may be more readily ascertained from consideration of the detailed description when read in conjunction with the accompanying drawings in which:

DETAILED DESCRIPTION OF THE DRAWING

Figure 1:
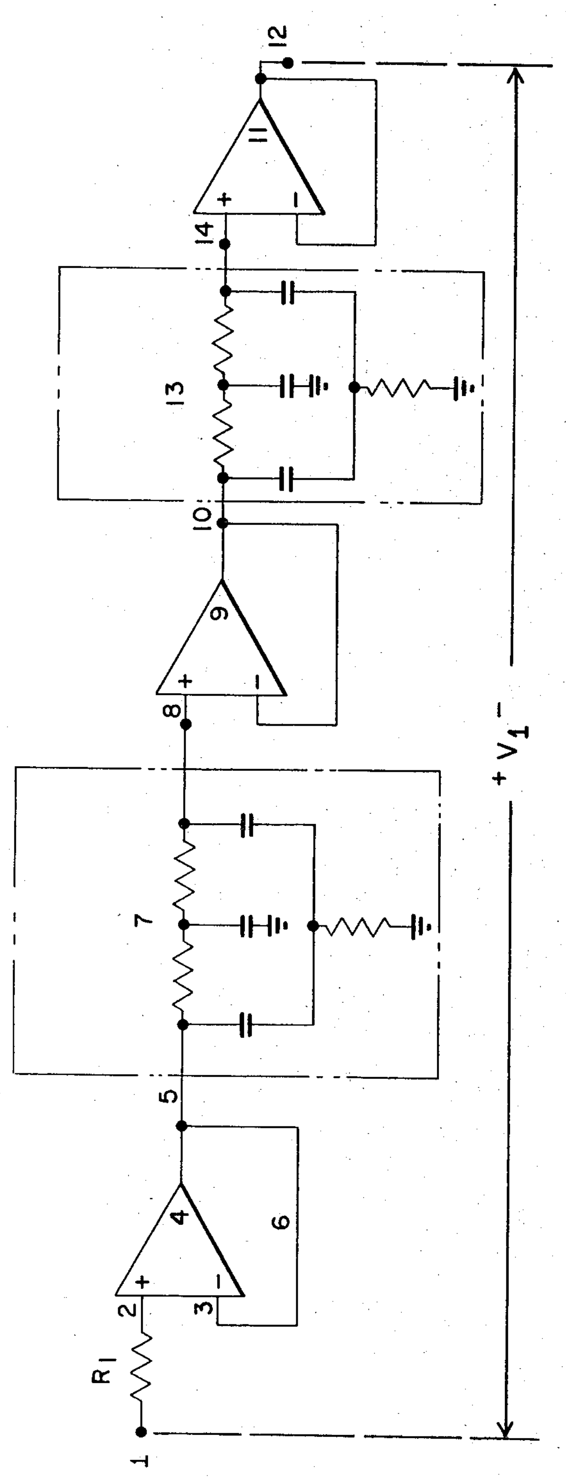
FIG. 1 depicts a typical prior art low pass multistage active filter illustrating the customary RC coupled multistage amplifier and unity gain biasing arrangements, included to demonstrate the problems to which the invention is directed.

Referring to FIG. 1, there is shown a typical prior art, low pass multistage active filter. The filter comprises a plurality of operational amplifier stages 4, 9 and 11 employed as unity voltage gain amplifiers and includes typical prior art negative degenerative feedback. An input resistance impedance $R_1$ is connected between a filter input terminal 1 and a positive phase non-inverting input terminal 2 of first operational amplifier stage 4. An RC coupling passive filter network 7 such as is well known in the art is connected between an output terminal 5 of first operational amplifier stage 4 and an input terminal 8 of operational amplifier stage 9. An RC coupling passive filter network 13, also well known in the art, is connected between an output terminal 10 of intermediate operational amplifier stage 9 and an input terminal 14 of the next succeeding operational amplifier stage 11. In this arrangement the overall circuit offset voltage $V_1$ is determined by the sum of the offsets created in each of the three stages. In the worst case these offsets will all be of the same polarity. The following paragraph shows the offset voltage for one such stage.

Figure 2:
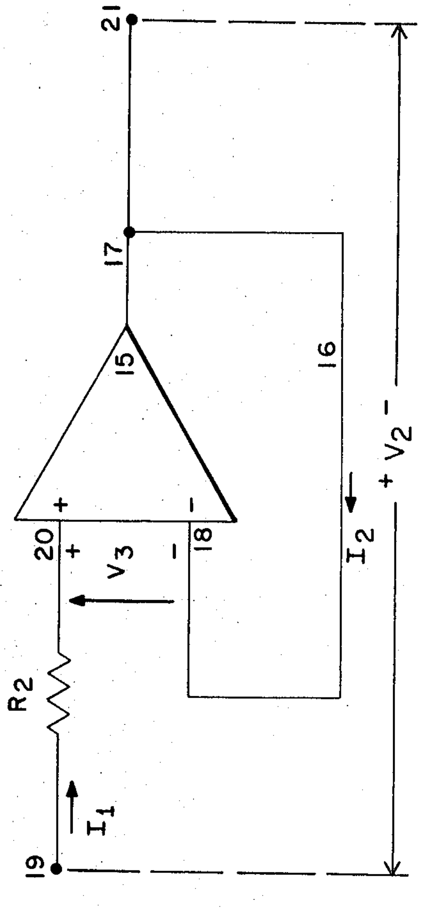
FIG. 2 depicts a typical prior art unity gain single stage operational amplifier illustrating a directly connected feedback circuit, included to also demonstrate the problems to which the invention is directed.

Referring to FIG. 2, a single prior art unity gain operational amplifier stage 15 is shown. Degenerative direct feedback arrangement 16 consists in connecting output terminal 17 of operational amplifier 15 back to its negative phase input terminal 18. A finite input resistor $R_2$ representing the resistive portion of an impedance network such as 7 and 13, necessary in order to make operational amplifier 15 a useful circuit, is connected between the input to the circuit terminal 19 and the positive input to the operational amplifier 15 at terminal 20. The offset voltage across the stage is $V_2$. It is the algebraic sum of the voltage drop across $R_2$ and the input offset voltage $V_3$. In the worst case these voltages will be of the same polarity. The circuit offset voltage is:

$$V_2 = (R_2)\ (I_1) + V_3$$

where $I_1$ is the bias current of the amplifier 15 and $V_3$ is the offset voltage of the amplifier 15. As pointed out previously, $I_1$ and $V_3$ are specified as to maximum value by the fabricator of the amplifier. A reduction in $V_2$ could be made by reducing the value of $R_2$, lessening the effect of $I_1$. However, $R_2$ is part of a complex impedance circuit and any reduction in resistance would require a proportionate increase in capacitor values. Therefore there is a practical lower limit for $R_2$ in any given design.

Figure 3:
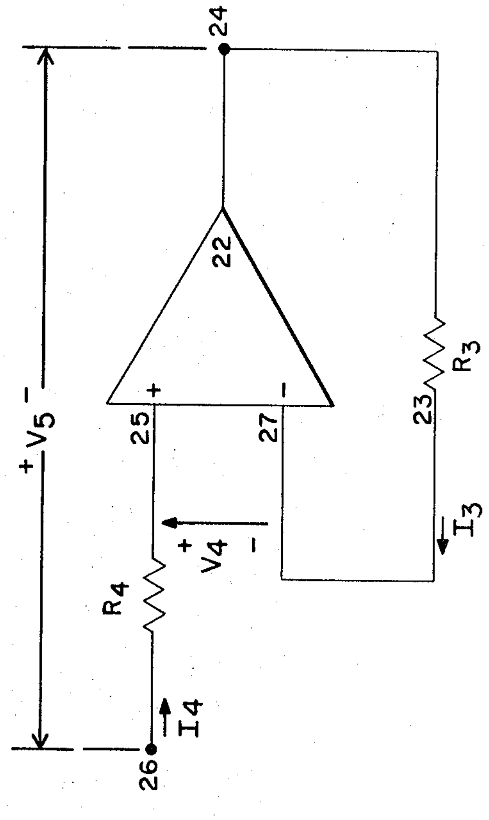
FIG. 3 depicts a single stage unity gain operational amplifier illustrating an improvement in the customary directly connected feedback arrangements found in prior art single stage unity gain operational amplifiers, in accordance with the principles of this invention.

Referring to FIG. 3, there is shown a single stage unity gain operational amplifier 22 employing an improvement over the typical prior art feedback circuit illustrated at FIG. 1 and FIG. 2. The improvement is made by inserting resistance $R_3$ in a negative feedback loop 23 between output terminal 24 of operational amplifier 22 and its negative phase inverting input terminal 27. Resistance impedance $R_4$ is connected between operational amplifier 22, positive phase non-inverting input terminals 25 and circuit input terminal 26. In this circuit the value of feedback resistor impedance $R_3$ substantially matches in value the value of input resistor impedance $R_4$.

Again referring to FIG. 3 the total offset voltage of the stage can be calculated as follows:

$$V_5 = (R_4)\ (I_4) + V_4 - (R_3)\ (I_3)$$

Since $R_3$ has been made equal to $R_4$ the equation reduces to:

$$V_5 = (R_4)\ (I_4 - I_3) + V_4$$

The bias currents $I_3$ and $I_4$ for the amplifier are both of the same polarity. The difference $I_4 - I_3$ will always be smaller than $I_4$ or $I_3$ taken individually. This difference between the two bias currents is called offset current and is typically 10 to 50 percent of the bias current. It can be concluded therefore that the offset of the improved circuit $V_5$ of FIG. 3 is less than the offset of the prior art circuit $V_2$ of FIG. 2.

Figure 4:
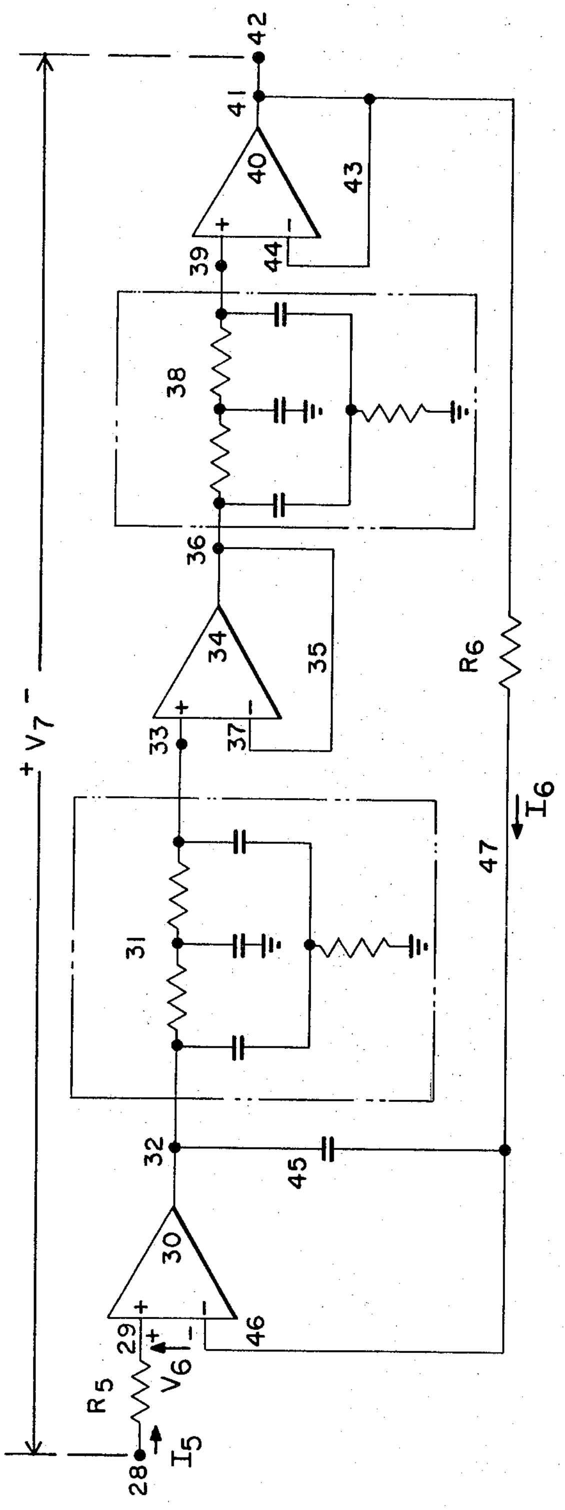
FIG. 4 depicts a low pass multistage active filter circuit constructed in accordance with the present invention.

Referring to FIG. 4, there is shown a low pass multistage active filter in the preferred embodiment of this invention. Resistance impedance $R_5$ is connected between input terminal 28 of the filter and positive input terminal 29 of operational amplifier stage 30. RC coupling circuit 31, which is a type of filter well known in the art and determined by the desired filter characteristics, is connected between an output terminal 32 of first operational amplifier stage 30 and an input terminal 33 of intermediate operational amplifier stage 34. Intermediate operational amplifier stage 34 employs a conventional unity gain type negative feedback loop 35 connected between output terminal 36 of operational amplifier 34 and its negative input terminal 37. An RC coupling circuit 38, which is also a type of filter well known in the art and determined by the desired filter characteristics, is connected between output terminal 36 of intermediate operational amplifier stage 34 and a positive input terminal 39 of the last operational amplifier stage 40. Last stage operational amplifier 40 includes the operational amplifier output terminal 41 and the filter output terminal 42. A conventional unity gain type negative feedback arrangement 43 is connected between operational amplifier 40, output terminal 41 and its negative input terminal 44.

A negative feedback loop 47 which includes a serially connected resistor impedance $R_6$ is connected between output terminal 41 of the last operational amplifier 40 and negative phase input terminal 46 of the first operational amplifier 30. A capacitor impedance 45 is connected between output terminal 32 of operational amplifier 30, and the external negative feedback loop 47 at negative phase input terminal 46. The overall offset of the filter ($V_7$) may be written mathematically as:

$$V_7 = (I_5)\ (R_5) + V_6 - (I_6)\ (R_6)$$

and since $R_5 = R_6$ by design $$V_7 = (I_5 - I_6)\ (R_5) + V_6$$

Therefore the circuit offset voltage is independent of the characteristics of all stages except the first. That is, it is the same as for the one stage circuit of FIG. 3.

Referring now to the operation of prior art filters as shown in FIGS. 1 and 2, inherent voltage offset is produced in each operational amplifier stage (shown at FIG. 2 for one stage). Further, $I_1$ will flow through resistor $R_2$ into the positive phase terminal 20 of operational amplifier 15 and cause voltage offset to be developed across resistor $R_2$. Further, voltage offsets similar to $V_2$ also will be produced at each operational amplifier stage and will add to voltage offsets of other operational amplifier stages 4, 9 and 11. The overall circuit offset voltage of the filter shown in FIG. 1 is N times the offset voltage of the circuit shown in FIG. 2 (where $N$ = number of stages) in the worst case.

Application of the improvement of this invention to prior art low pass multistage filters will result in a decrease in the value of total filter voltage offset to between one-fifth and one-tenth of the filter's original value for total voltage offset.

Referring again to FIG. 4, it has been made clear that placing a feedback path 47 around the entire filter circuit and placing in that feedback circuit a resistor whose value is equal to the resistance value of the input impedance act to reduce significantly the offset voltage of the filter. However, such feedback is undesirable at the pass frequencies of the filter as it destroys the filter's characteristics.

Capacitor 45 placed around amplifier 30 from its output to its negative input serves to eliminate feedback path 47 at those frequencies, whereupon amplifier 30 becomes a unity gain separator just as in prior art circuit. Therefore, the invention provides a reduced circuit offset voltage without affecting the filter's pass band characteristics.

While there has been described what is thought to be a preferred embodiment of the present invention, variations and modifications will occur to those skilled in the art once they become familiar with the desired embodiment of the invention. Therefore, it is intended that the appended claims should be construed to include all such variations and modifications as fall within the true spirit and scope of the invention.

What we claim as new and desire to secure by Letters Patent of the United States is:

1. In a filter circuit including in combination, a plurality of cascaded amplifier stages coupled to one another through filter elements and exhibiting a unity voltage gain over each stage, the first of said amplifier stages having first and second input terminals and an output terminal, the last of said amplifiers having an output terminal, a filter circuit input, and an input impedance connected in series between said first terminal and said filter circuit input, the improvement comprising:

a first negative feedback circuit comprising a first feedback impedance connected between said output terminal of said last amplifier and said second input terminal, a second negative feedback circuit comprising a second feedback impedance connected between said second input terminal of said first amplifier and said output terminal of said first amplifier, said second feedback impedance being dimensioned such that at and above the cut-off frequency of the filter circuit its impedance value is substantially lower than that of said first feedback impedance, whereas for direct current its impedance value is substantially higher than that of said first feedback impedance and said first feedback impedance being dimensioned such that for direct current its impedance value is substantially equal to that of said input impedance.

2. A filter circuit as defined in claim 1 wherein said first feedback impedance is a resistance.

3. A filter circuit as defined in claim 2 wherein said second feedback impedance is a capacitance.

4. A filter circuit as defined in claim 3 wherein said amplifiers are operational amplifiers.

5. A filter circuit as defined in claim 4 wherein said input impedance is a resistance.

6. A filter circuit as defined in claim 5 wherein each of said filter elements comprise a passive filter network serially connected between each pair of successive amplifier stages.

7. A filter circuit as defined in claim 1 wherein said first impedance is a resistance, said second impedance a capacitance, said input impedance a resistance, said amplifiers being operational amplifiers and said filter elements each comprising a resistance-capacitance network.

* * * * *